United States Patent [19]
Webster

[11] 4,006,468
[45] Feb. 1, 1977

[54] DYNAMIC MEMORY INITIALIZING APPARATUS

[75] Inventor: Marvin K. Webster, Glendale, Ariz.

[73] Assignee: Honeywell Information Systems, Inc., Waltham, Mass.

[22] Filed: Sept. 2, 1975

[21] Appl. No.: 609,754

Related U.S. Application Data

[63] Continuation of Ser. No. 386,128, Aug. 6, 1973, abandoned.

[52] U.S. Cl. .................. 340/173 DR; 340/172.5; 340/173 R
[51] Int. Cl.² .......................................... G11C 7/00
[58] Field of Search ...... 340/173 DR, 172.5, 173 R

[56] References Cited
UNITED STATES PATENTS

| | | | |
|---|---|---|---|
| 3,636,528 | 1/1972 | Morris | 340/173 CA |
| 3,685,027 | 8/1972 | Allen et al. | 340/173 R |
| 3,699,539 | 10/1972 | Spence | 340/173 R |
| 3,719,932 | 3/1973 | Cappon | 340/173 R |

OTHER PUBLICATIONS

IBM Reference Manual–IBM 7080 Data Processing System, pp. 88–89 (1961).

*Primary Examiner*—Stuart N. Hecker
*Attorney, Agent, or Firm*—E. W. Hughes; W. W. Holloway, Jr.

[57] ABSTRACT

Initializing apparatus for a dynamic memory causes data to be written into a different cell of each array of the memory during each refresh cycle until all the memory cells of the arrays have data written into them. The memory initializing apparatus then ceases causing data to be written into the array during subsequent refresh cycles.

4 Claims, 11 Drawing Figures

DYNAMIC MEMORY INITIALIZING APPARATUS

CROSS REFERENCE TO RELATED APPLICATIONS

This application is a continuation of application Ser. No. 386,128 filed Aug. 6, 1973, for Dynamic Memory Initializing Apparatus now abandoned.

BACKGROUND OF THE INVENTION

This invention relates to initializing apparatus for a dynamic memory and more particularly to apparatus which, in conjunction with circuit means for periodically refreshing the data represented by a voltage stored in the cells thereof, causes voltage representing binary data, zeros or ones, to be written into the memory cells of such a memory during each refresh cycle after power is initially applied to the memory until all the cells of each array of the memory have been initialized, i.e., data has been written into them.

In modern data processing equipment many advantages are achieved by utilizing insulated gate field effect transistors known as MOS transistors or MOSFET transistors for the memory cells of a digital computer. Either P-channel or N-channel device may be utilized for this purpose. Memory cells utilizing MOS transistors require less complex processing techniques and permit a greater packing density which characteristics result in considerable savings in the cost of such memories and in the volume occupied by them. This is particularly important because of the large number of memory cells required by modern computers.

Dynamic memories utilizing MOS transistors have some disadvantages which have limited their use in modern data processing equipment. One of the disadvantages of a dynamic MOS memory is that data represented by a voltage stored in a cell deteriorates or decreases in value relatively rapidly as a function of time and thus must be periodically refreshed or restored if the validity or accuracy of the data is to be maintained. Thus, such a memory must necessarily include circuitry which periodically provides refresh cycles so that the voltage stored in each cell is restored substantially to its original value periodically before the probability of the data being valid or correct is reduced to an unacceptably low value.

Another disadvantage of dynamic memories utilizing MOS transistors for the storage of data occurs when power is initially applied to the memory. At that time the voltages stored in the cells in at least enough of the cells to be statistically significant will have values representing binary data such that any error detection and correction means (EDAC), such as are generally associated with such a memory, will sense uncorrectable errors. In some memory systems with EDAC the presence of such errors prevents or inhibits data from being written into some of the cells at a memory location or address if such an error or errors are detected in data stored at that address.

In prior dynamic MOS memories the problems associated with the initial application of power to the memory was solved by loading or reading into all the locations of the memory data from an appropriate source, sometimes known as bootloading the memory. In bootloading a memory, magnetic tapes or punch cards, for example, provide the data to be written into the cells of the memory. A disadvantage of bootloading a memory is that bootloading requires a considerable period of time and also requires that all of the subsystems of a computer system be utilized to accomplish it.

The disadvantages of the prior art are alleviated by the present invention by supplementing the circuits required to periodically refresh the memory cells of the dynamic memory so that when power is initially applied to the memory the refresh circuitry is supplemented so that it has the capability of writing data into each of the memory cells of each of the arrays constituting such memory. The rate at which this happens is one cell per array per refresh cycle. This function continues until all the cells of each array of the memory have data written into them in this manner. Thus, the present invention eliminates the need for bootloading data from punch cards, magnetic tape, or magnetic disks when a computer memory is initially energized.

It is therefore an object of this invention to provide new and improved apparatus for initializing a dynamic memory.

Another object of this invention is to provide simplified apparatus for initializing a dynamic memory.

A further object of this invention is to provide apparatus for initializing a dynamic memory without using data from peripherals such as punch cards, magnetic tapes, and magnetic disks.

Still another object of this invention is to provide apparatus which initializes the dynamic memory storage cells of such a memory by supplementing the refresh cycle circuits of the dynamic memory so that such circuits can be used to write data into the cells of the memory.

SUMMARY OF THE INVENTION

The foregoing objects are achieved in the present invention by providing apparatus which in conjunction with the refresh cycle circuit means of the dynamic memory writes binary data into each of the memory cells when power is first applied to the memory. At the time the apparatus has written data into all the cells of the memory, it disables itself so that the refresh circuitry then functions in its normal manner. The apparatus constituting this invention is relatively simple and inexpensive to construct, and it avoids the necessity of bootloading the memory from peripheral devices utilizing many, if not all, of the subsystems of a computer.

Other objects and advantages of this invention will become apparent from the following description when taken in conjunction with the accompanying drawings.

DESCRIPTION OF THE PREFERRED EMBODIMENT

Figure 1:
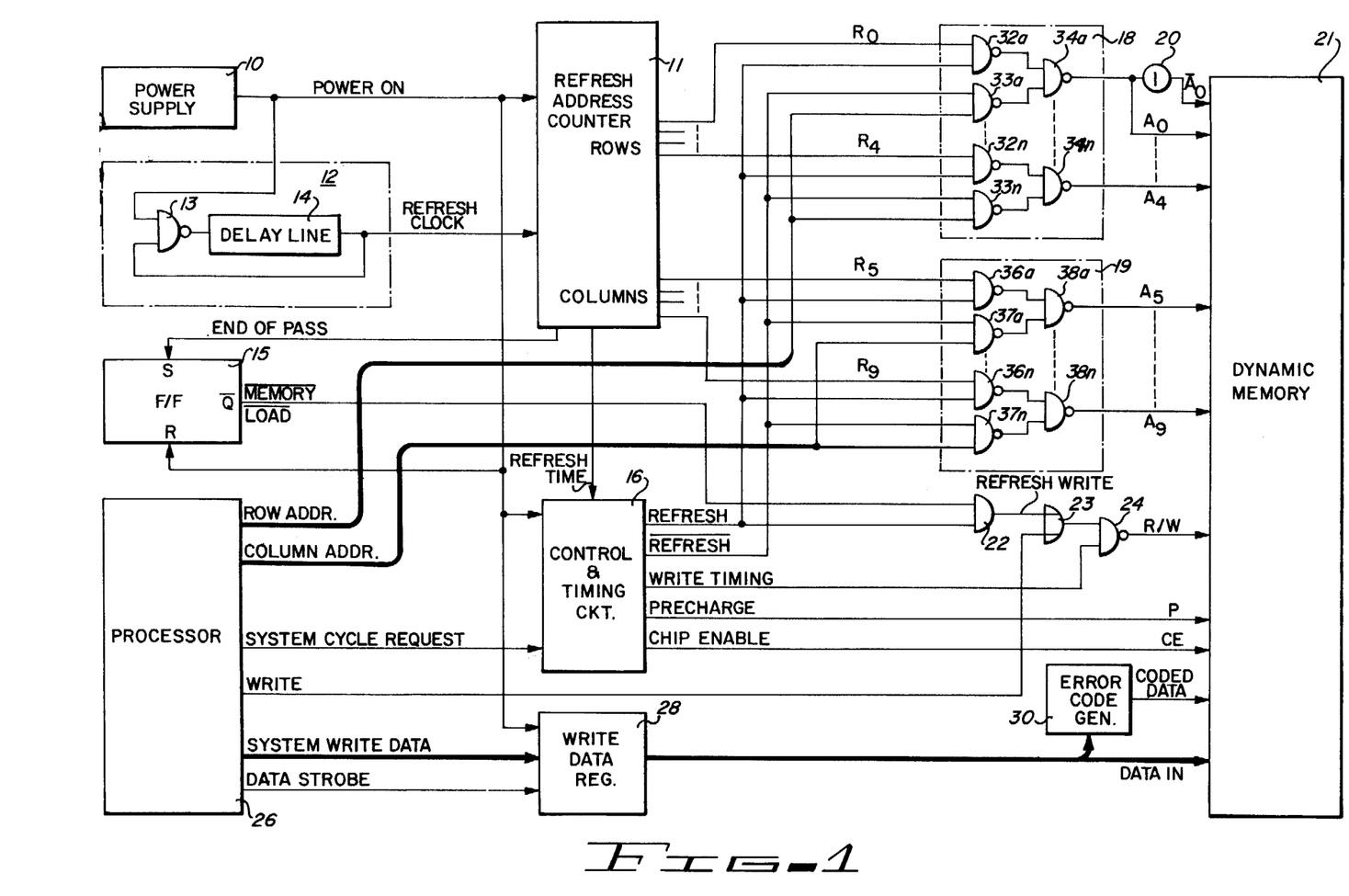
FIG. 1 is a diagram of one embodiment of the present invention.

In FIG. 1 there is shown schematically the necessary circuit and control components to refresh data that has been written into dynamic memory 21 and the elements of the invention which in conjunction with the refresh circuitry can cause data to be written into dynamic memory 21 when power supply 10 is turned on. The major components illustrated are the address means for generating signals which represent the address of a cell of each of the arrays of the memory, refresh address counter 11; the initializing circuit, end of pass flip-flop 15 and gates 22 and 23; control and timing means 16; row address selector 18; column address selector 19; and write data register 28. Dynamic memory 21 can be initialized, for example, by writing signals representing zeros into all the data storage cells of all its arrays before processor 26 is enabled to write data into memory 21.

Figure 2:
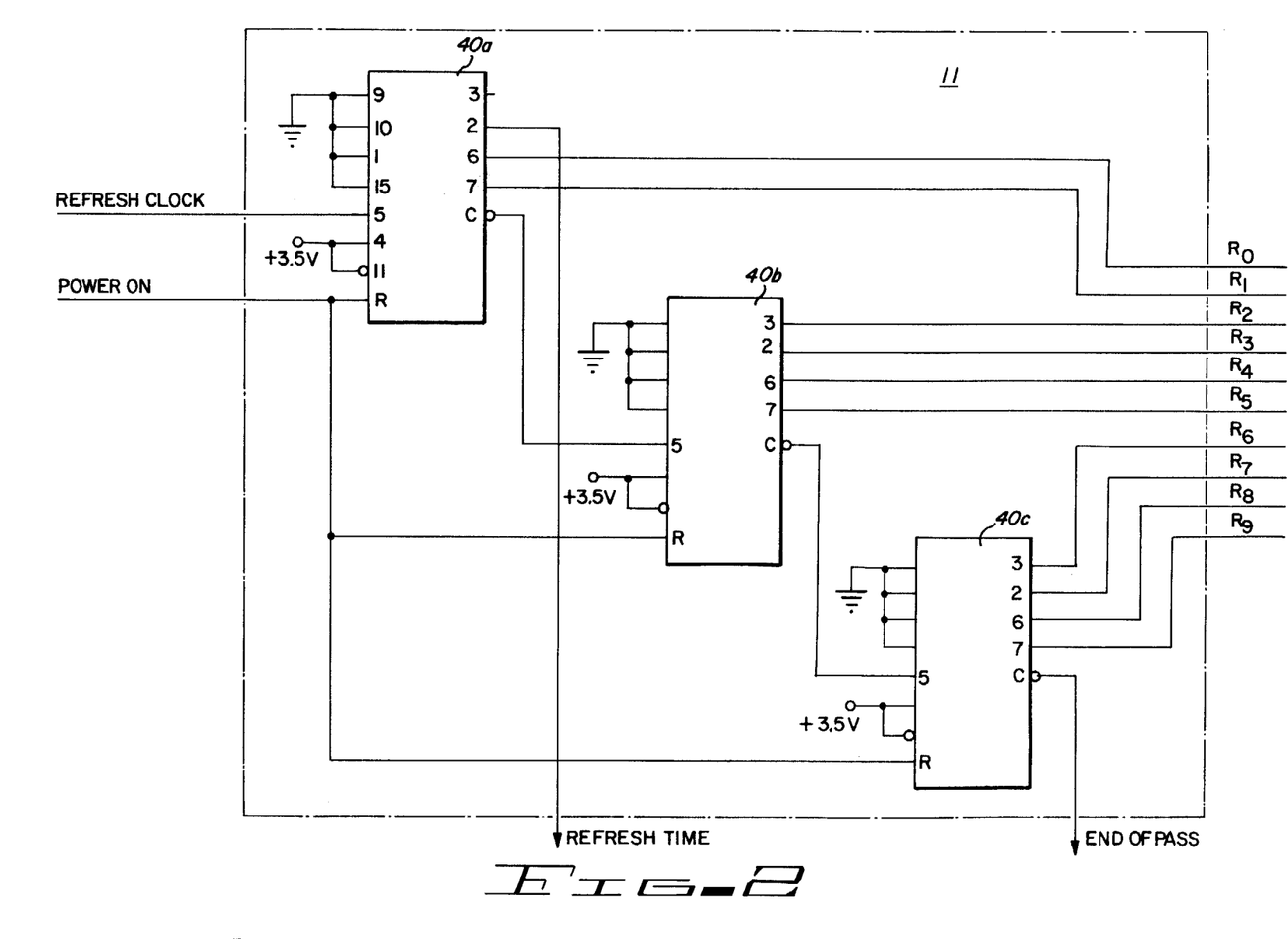
FIGS. 2-5 illustrate details of various portions of the appartus shown in FIG. 1.
Figure 3:
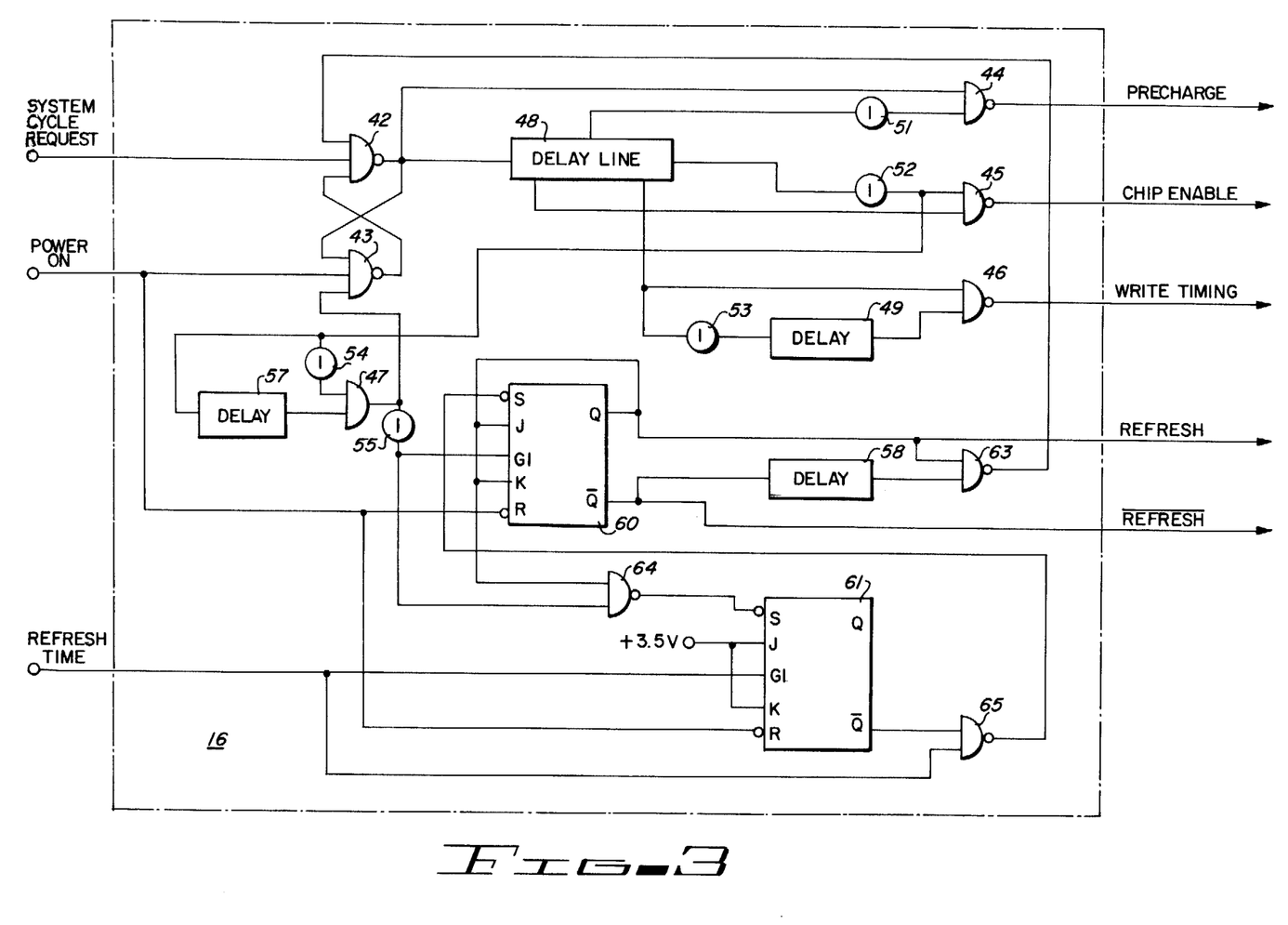
Figure 4:
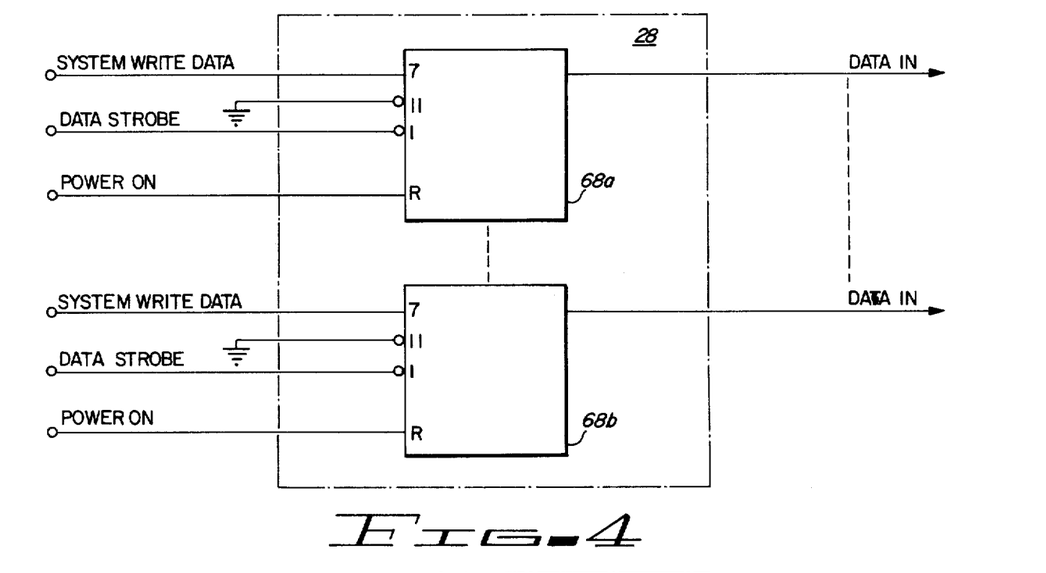

Signals representing binary zeros, in a preferred example, are present on the DATA IN bus because the output of power supply 10 is connected to the reset terminal R of each of the latches constituting write data register 28 as is illustrated in FIG. 4. Thus, when power supply 10 is energized the output of each of the latches will represent a binary zero. The output of power supply 10 is also connected to the reset terminals R of counters 40 of refresh address counter 11 and the reset terminals R of flip-flops 60 and 61 of control and timing circuit 16 as is illustrated in FIGS. 2 and 3 respectively. As a result, when power supply 10 is turned on the signals $R_0$-$R_9$ of refresh address counter 11 in the preferred embodiment designates row zero column zero, and the control and timing circuit 16 is also placed in its predetermined initialized condition. It should be noted that when power supply 10 is turned on or energized oscillator or clock 12 will begin to produce REFRESH CLOCK signals or clock signals which are applied to refresh address counter 11.

During normal operation of a computer, a portion of which is illustrated in FIG. 1, i.e., subsequent to initialization of memory 21, processor 26 will provide row and column address signals, the data to be written into memory 21, the SYSTEM CYCLE REQUEST signal, the WRITE signal, and the DATA STROBE signal. The manner in which the processor 26 reads data from dynamic memory 21 is not illustrated since this is conventional and is not necessary to explain the present invention.

Periodically during normal operation processor 26 is inhibited for a period of time from writing or reading data from the memory. During this period refresh counter 11 provides a REFRESH TIME signal to control and timing circuit 16. As a consequence, control and timing circuit 16 will provide a REFRESH signal which gates row and column address signals to dynamic memory 21. During each refresh period or cycle all the cells in a row corresponding to the row designated by the signals $A_0$-$A_4$ of row address selector 18 of each array will be refreshed. In a typical dynamic MOS memory, the preferred embodiment being a memory using INTEL 1103 silicon gate MOS random access memory elements, the signals stored in a cell should be refreshed once every 2000 microseconds to insure that the signal representing data stored in a cell remains correct. Thus, in order to make sure that each cell in an array is refreshed before the probability that the magnitude of the signal has changed to the point where it is not determinable, the period of the refresh cycles is made equal to or less than the maximum reliable storage period of the cells divided by the number of rows in an array. If, for instance, the array of cells has 32 rows and 2000 microseconds is as long as confidence in the reliability of the stored data remains acceptably high, then a refresh cycle should occur no less frequently than once every 64 microseconds. In the preferred embodiment the refresh cycle was chosen as once every 32 microseconds to increase the degree of confidence in the accuracy of the data stored. Thus, in a typical MOS type of dynamic memory where it may require approximately one microsecond for a read/write cycle, 31 cycles of operation of dynamic memory 21 will be devoted to reading or writing data and the 32nd cycle will be devoted to refreshing the cells of the arrays of the dynamic memory one row per array per refresh cycle.

During the time that data is being written into dynamic memory 21 from write data register 28, parity generator 30 will develop appropriate parity bits which are stored in arrays of the memory utilized for this purpose, the address of the cells in these arrays is the same as the address of the data stored in the other arrays.

Since the present invention pertains to MOS dynamic memories, a full description of such memories would be quite lengthy; further, it is unnecessary to describe all the details of a dynamic MOS memory to completely describe the present invention. Therefore, most of the details of such memories which are well known in the art will be omitted from this description. However, a basic description of a dynamic MOS memory cell will be given to facilitate understanding the environment in which the present invention is placed. Accordingly, reference is made to FIG. 8 which is a schematic diagram of a basic memory cell of a dynamic MOS memory. The basic memory cell shown in FIG. 8 includes a write control MOS transistor 85a, a storage MOS transistor 85b, a read control transistor 85c and a refresh amplifier 75. Each of the transistors of the MOS memory cell includes a source, a drain and a gate. The source of write control transistor 85a is connected to the DATA A line, the drain of transistor 85a is connected to the gate of transistor 85b and the gate of transistor 85a is connected to the WRITE SELECT line. Each of the MOS transistors may be a MOSFET or metal oxide semiconductor field effect transistor. A MOSFET consists of two P type regions, the source and the drain, if used on an N type substrate. The gate is an aluminum plate insulated from the substrate by a layer of silicon or glass. If a positive DC voltage is applied to the source so that the source is more positive than the drain, current will flow from the source to the drain. A positive bias on the gate decreases conductivity between the source and the drain of the MOSFET and a negative bias on the gate increases the conductivity.

Figure 8:
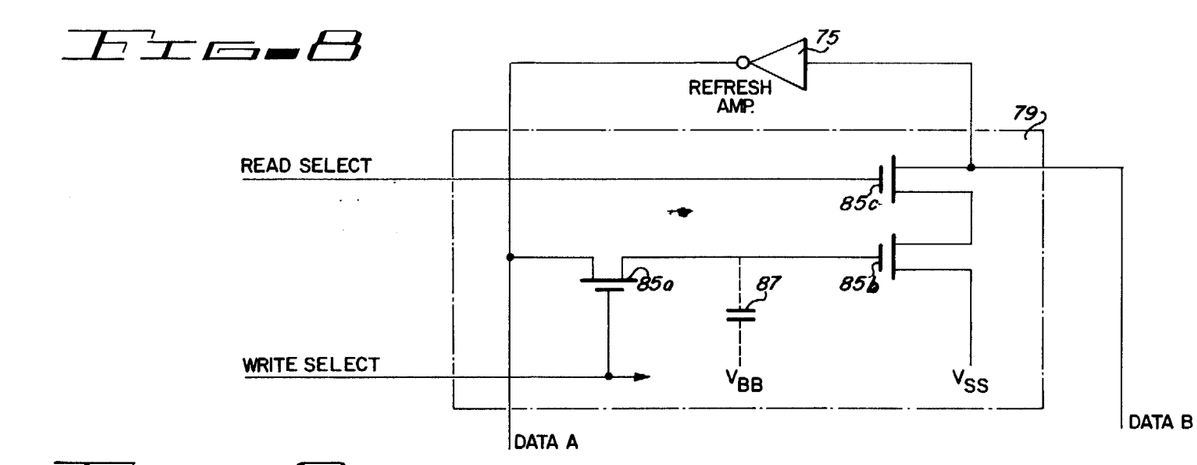
FIG. 8 illustrates the circuit of a typical cell used in a dynamic MOS memory.

When it is desired to write into a memory cell a data signal is placed on the DATA A line and a low voltage is placed on the WRITE SELECT line of FIG. 8. The low voltage on the gate of transistor 85a turns on transistor 85a so that the signal or voltage on DATA A line will be applied to the gate of transistor 85b and will appear across capacitor 87. Capacitor 87 is not a separate physical entity but represents the capacitance between the gate of transistor 85b and the substrate bias voltage $V_{BB}$. The magnitude of this capacitance of capacitor 87 is quite small so that only a small amount of current is required to charge capacitor 87. The magnitude of voltage stored across capacitor 87 is substantially the same as the voltage applied on DATA A line. The impedance of the insulation between the gate of transistor 85b and the semiconductor substrate is such that a very small amount of current can leak through the insulating material between the gate and the substrate of the transistors so that the charge stored across capacitor 87 will decrease as a function of time. Thus, a charge, or voltage, which represents data stored by the cell will also decrease with time. To prevent data represented by the magnitude of the voltage or charge stored across capacitor 87 from being lost, it is necessary to recharge or refresh the stored voltage.

When it is desired to read the contents of a cell, a low value of voltage is placed on the READ SELECT line thereby rendering transistor 85c conductive. If a low value of voltage representing a binary zero is stored on capacitor 87, transistor 85b will be rendered conductive and the voltage $V_{SS}$ connected to the source of transistor 85b will be applied through transistors 85b and 85c to the DATA B line and through it to the input of refresh amplifier 75. Refresh amplifier 75 amplifies and inverts voltage $V_{SS}$ thereby providing a low voltage at the output of refresh amplifier 75 which is connected to the DATA A line. If a high voltage representing a binary one were stored on capacitor 87 this high voltage would make transistor 85b nonconductive so that voltage $V_{SS}$ is not applied to refresh amplifier 75 with the result that a low value of voltage is applied to the input of amplifier 75. Amplifier 75 inverts this low voltage, thereby providing a high voltage representing a binary one to the DATA A line.

In the circuit shown, low voltages may be applied simultaneously to the READ SELECT and the WRITE SELECT line so that the data or voltage across capacitor 87 is restored to its correct value through transistor 85a. To state it another way, the voltage on DATA A line is gated through write control transistor 85a to recharge capacitor 87 to its initial value; which is in effect refreshing or restoring the voltage representing the data stored in the memory cell to its original value.

Figure 6:
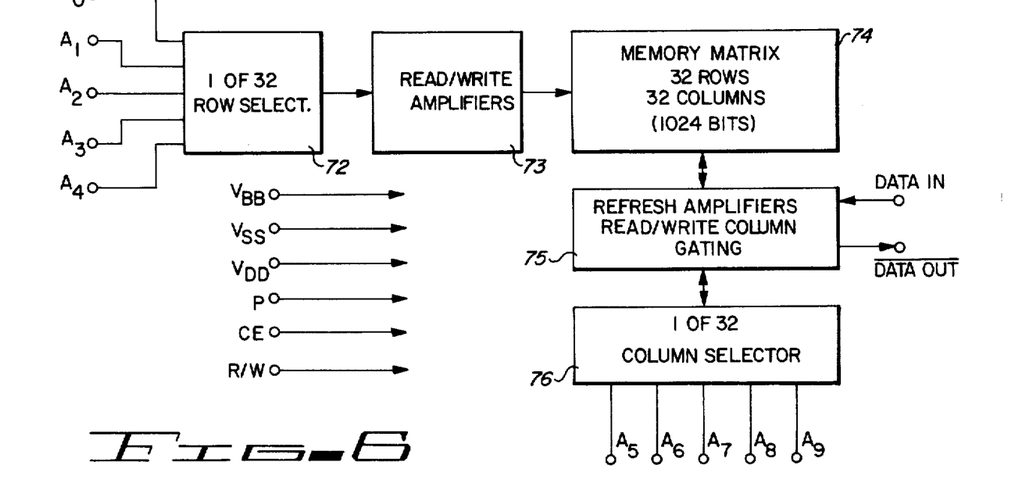
FIGS. 6 and 7 is a block diagram which illustrate details of a dynamic MOS memory.
Figure 7:
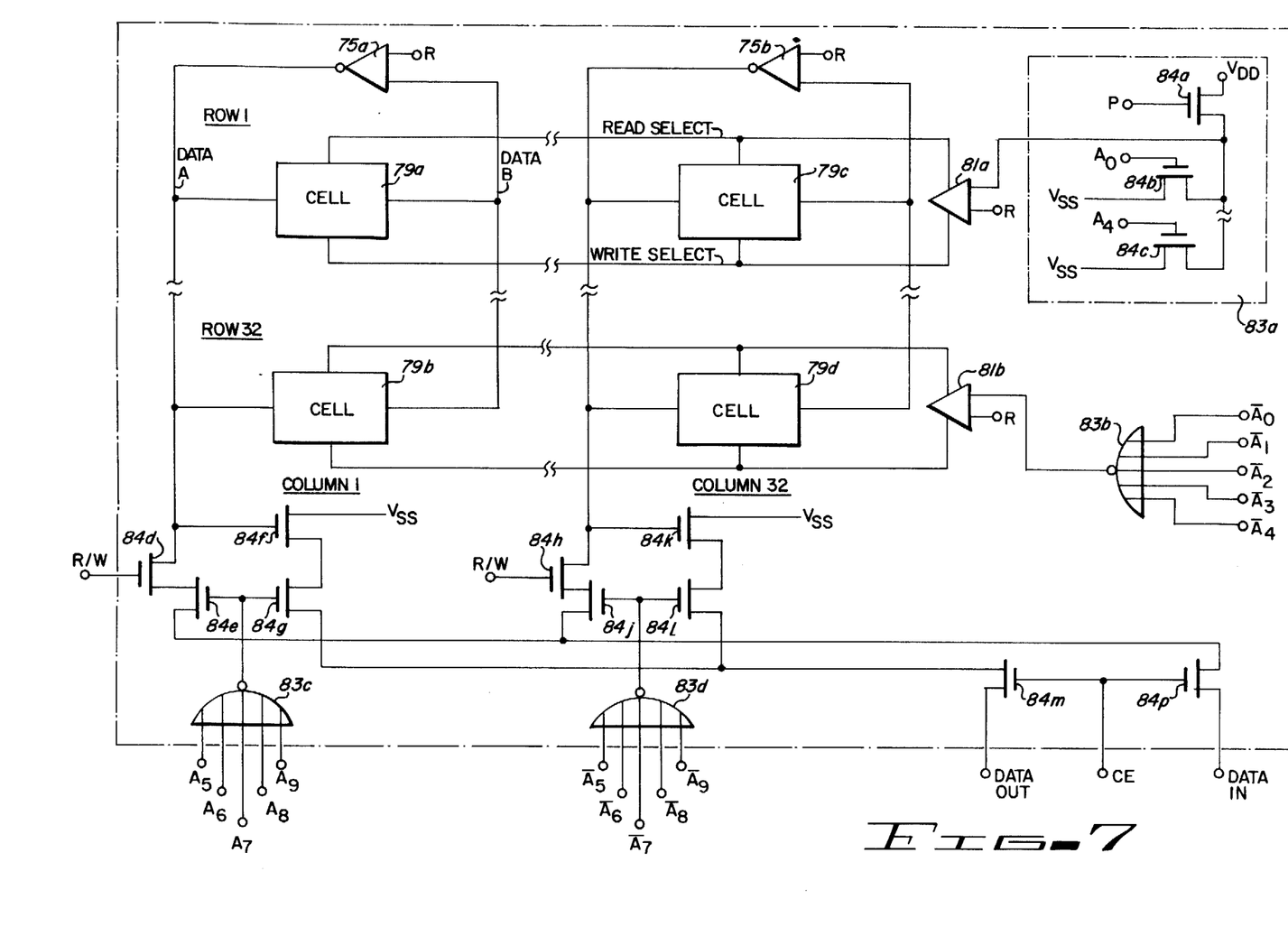

A plurality of matrices or arrays 74, as shown in FIG. 6, up to 80 in a preferred embodiment, of memory cells of the type shown in FIG. 8 may be arranged to provide a portion of a typical dynamic MOS memory for a computer with each array having 1024 cells. Each array of such a MOS memory may have its 1024 cells arranged in 32 rows and 32 columns. Only a small number of the cells and a small portion of a single matrix or array and their associated logic gates are shown in FIG. 7. Obviously, a smaller or a greater number of cells may be included in each array. The voltages and the signals shown in FIG. 6 are applied to the various portions of the circuit and to the cells of the type shown in FIG. 8.

Referring to FIG. 7, each array or matrix of dynamic MOS memory includes a plurality of the refresh amplifiers 75 and driver amplifiers 81. A refresh amplifier is used to refresh the cells 79 in a column of an array. A driver amplifier 81 when energized provides signals to the READ SELECT and WRITE SELECT lines of a given row. Data to be written into the memory of FIG. 7 is applied as a voltage pulse or signal to the DATA IN terminal where the presence of a CE or chip enable signal causes the transistor 84p to be rendered conductive so that the data signal can be applied to one of the DATA A lines in the array. For example, when it is desired to write data into cell 79a in column 0 row 0, signals A5–A9 are applied to the input leads of NOR-gate 83c. Signals A5–A9 if they have the correct values, i.e., they correspond to column zero, cause NOR-gate 83c to apply a negative voltage pulse to the gate of transistor 84e which causes transistor 84e to be conductive. If a R/W or write signal is applied to the gate of transistor 84d, transistor 84d becomes conductive so that the data signal applied to the DATA IN terminal is coupled to the DATA A line of the cells in column 0. The signal or voltage on the DATA A line is then written into the cell of column 0 whose driver, i.e., 81a in this example, is energized by the application to it of a signal from the row select NOR-gate 83a and the signal designated R. A voltage pulse on the WRITE SELECT line of cell 79a causes this cell to receive and store the data signal which is placed on the DATA A line. It should be understood that each of the other NOR-gates 83 illustrated in FIG. 7 has a precharge input terminal P to which the precharge signal P is applied.

When it is desired to read data out of a cell, the cell is identified by the row and column signals A0–A4 and A5–A9 which are applied to the row and column NOR-gates 83. IF the cell 79a is the one from which data is to be read, then signals A0–A4 designating row zero will cause gate 83a to cause driver amplifier 81a to be energized and signals A5–A9 designating column zero will cause gate 83c to apply a low voltage pulse to the gate of transistor 84g. Simultaneously, a chip enable pulse is applied to the CE terminal to render transistor 84m conductive. When driver 81a produces a pulse on the READ SELECT line, the voltage across storage capacitor 87 of cell 79a controls the voltage of the DATA B line and column refresh amplifier 75a will then cause the appropriate voltage level to be applied to the DATA A line. A binary one on the DATA A line will cause transistor 84f to be nonconductive so that a low voltage will be applied to the data out terminal. A low voltage representing a binary zero on the DATA A line will cause the transistor 84f to be conductive so that the voltage $V_{SS}$ is connected and applied to the data out terminal of FIG. 7. A more complete description of the operation of a MOS memory array and of the arrangement of the arrays to form bytes or words may be found in the booklet entitled, "Fully Decoded Random Access 1024 Bit Dynamic Memory" by the Intel Corporation, Santa Clara, Calif., 1971.

Figure 9:
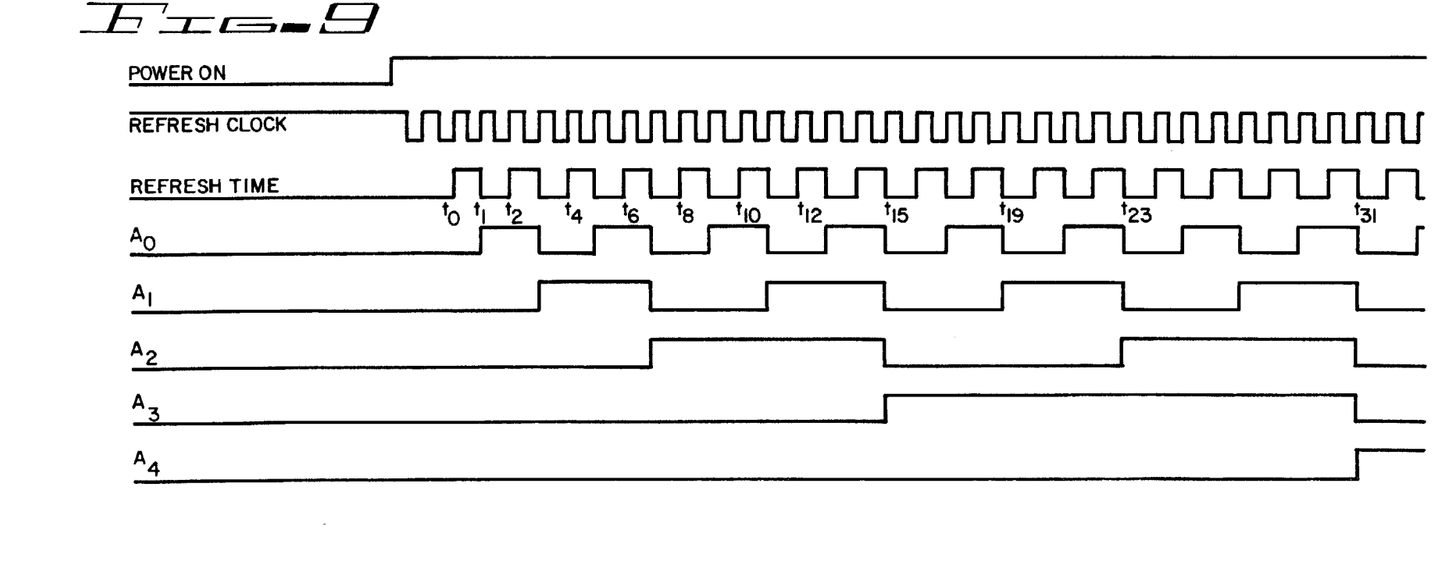
FIGS. 9-11 illustrate waveforms which are useful in explaining the operation of the present invention.
Figure 10:
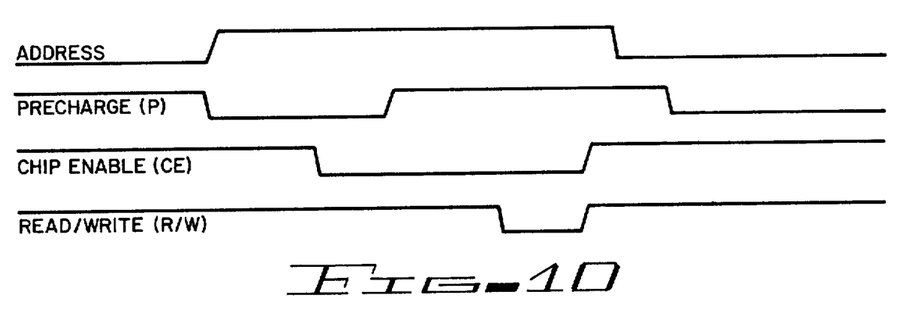

The operation of the refresh address counter 11 of FIG. 1 may be more clearly seen by referring to the diagram of FIG. 2 and the waveforms of FIG. 9. The counters 40a, 40b, and 40c shown in FIG. 2 may be one of several types, for example, the SN 74193 which is available from several manufacturers. Details of the SN 74193 may be found in the booklet "TTL Integrated Circuit Catalog Supplement from Texas Instruments" 1970 by Texas Instruments, Inc., Dallas, Texas. When the power-on signal as illustrated in FIG. 9 goes positive when power supply 10 is energized, counters 40a–40c of FIG. 2 have been reset and pulse generator 12 of FIG. 1 starts supplying REFRESH CLOCK signals. Counter 40a provides a REFRESH TIME output signal on pin 2 for every fourth REFRESH CLOCK pulse applied to its input terminal 5. This REFRESH TIME signal from counter 40a is applied to control and timing circuit 16 of FIG. 1. At the same time the REFRESH CLOCK pulses are divided by eight and applied to the output lead 6 of counter 40a and divided by sixteen and applied to the output lead 7 of counter 40a. Every 16th REFRESH CLOCK pulse produces a carry or C output of counter 40a which provides a pulse to counter 40b. Counter 40b operates in a manner similar to that described in connection with counter 40a. In turn, after 16 carry pulses from counter 40a have been applied to counter 40b, counter 40b produces a carry or C output pulse which is applied to counter 40c.

The signals $R_0$-$R_9$ from counter 11 of FIG. 2 are applied to the row address selector 18 and the column address selector 19. The REFRESH TIME signal from counter 40a is coupled to control and timing circuit 16 causing, as will be explained later, control and timing circuit 16 to provide a REFRESH signal to the input leads of the gates 32a–32n of row address selector 18 and to the gates 36a–36n of the column address selector 19. The REFRESH signal enable gates 32a–32n and 36a–36n to produce row address signals $A_0$ –$A_4$ and column address signals $A_5$ –$A_9$. Inverters, such as inverter 20, are used to provide $\overline{A_0}$–$\overline{A_9}$ signals to memory 21.

The function of pulse generator 12, refresh address counter 11, row address selector 18, and column address selector 19, is to produce sequentially the addresses of each of the cells of an array, one column after the other until the addresses of all of the cells in an array have been produced. If the frequency of the pulse generator 12 is one REFRESH CLOCK pulse every eight microseconds, a REFRESH TIME signal will be produced once every 32 microseconds, and row addresses will change once every 32 microseconds. At this rate it takes approximately 33,000 microseconds for the refresh counter and the row address and column address selectors to generate the addresses of all the cells in an array of 1024 cells.

When the power supply 10 has been turned on, the end of pass flip-flop 15 has been reset. Thus, while counter 11 subsequent to the energization of power supply 10 is generating the addresses of each of the 1024 cells in an array for example, end of pass flip-flop 15 provides a positive voltage, $\overline{Q}$, to the upper lead of AND-gate 22 of FIG. 1 enabling it. When control and timing circuit 16 provides a REFRESH signal to the lower lead of AND-gate 22 once every 32 microseconds, a signal is applied to the upper lead of OR-gate 23 as long as $\overline{Q}$ of flip-flop 15 is positive. The positive output of gate 23 is applied to the upper lead of AND-gate 24. Thus, when control and timing circuit 16 provides a WRITE TIMING pulse to the lower lead of gate 24, while a REFRESH signal is being produced, gate 24 provides a negative signal identified as R/W to the dynamic memory which causes the data signal applied to the DATA-IN terminal of each array as illustrated in FIG. 7 to be written into the cell of the array corresponding to the signals $A_0$–$A_4$ and $A_5$–$A_9$.

When the refresh address counter of FIG. 2 has produced signals corresponding to all of the rows and columns of an array of dynamic memory 21, it produces an "END OF PASS" signal on the carry output lead C of counter 40c. This END OF PASS signal is coupled to the set terminal of end of pass flip-flop 15 of FIG. 1 thereby setting flip-flop 15. When the end of pass flip-flop 15 is set, the voltage on the $\overline{Q}$ lead of flip-flop 15 no longer enables AND-gate 22 so that it is no longer possible to write data into a cell in an array of dynamic memory 21 when a REFRESH signal is produced by control and timing circuit 16.

Figure 11:
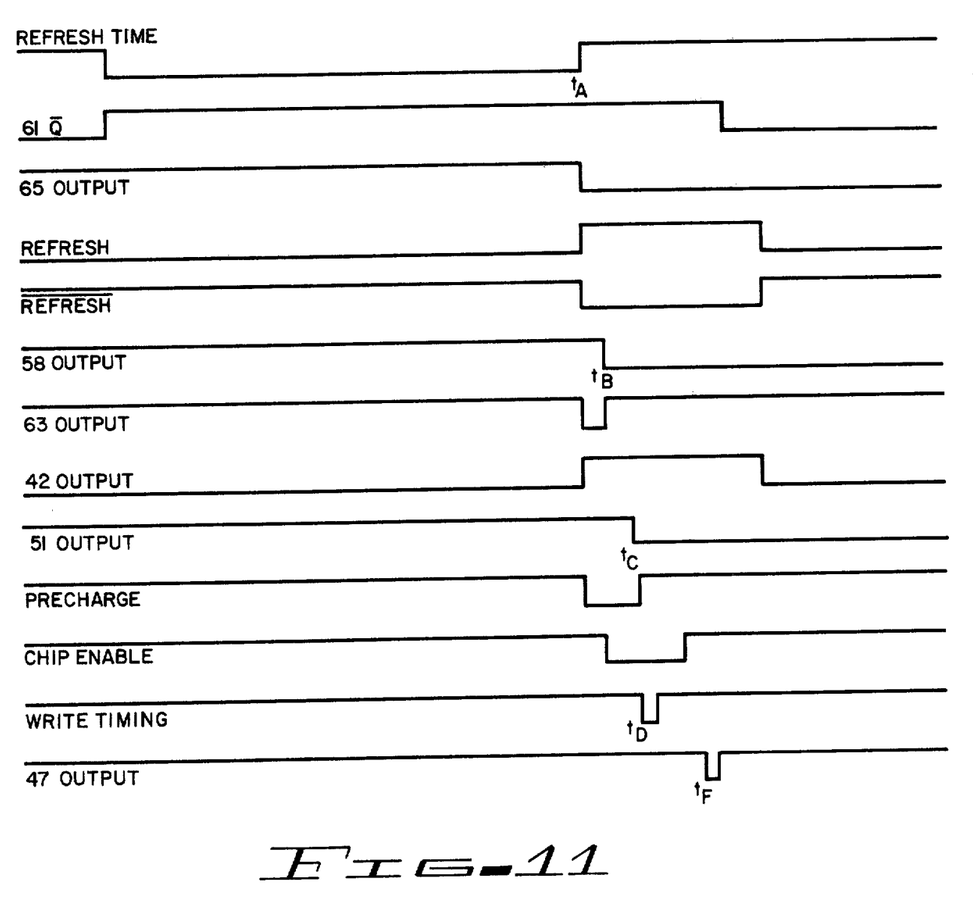

The operation of the control and timing circuit 16, shown in FIG. 3 is described in connection with the waveforms of FIG. 11 and the dynamic memory initializing apparatus of FIG. 1. When the power supply 10 of FIG. 1 is turned on, the POWER-ON signal causes JK flip-flops 60 and 61 of FIG. 3 to be reset. JK flip-flops are circuits designed to operate in either one of two stable states. In one state of operation a JK flip-flop represents a binary one (1-state) and in the other state, a binary zero (0-state). The leads entering the left side of flip-flop 60 of FIG. 3, for example, provide the required trigger signals. The J lead provides a set signal, the K lead provides a reset signal and the center or G1 lead provides the trigger signal. When the J and K leads are each positive, a negative signal on the G1 lead causes the flip-flop to change states. Signals applied to the S lead or the R lead of the flip-flop also provide set and reset capability. When a zero voltage potential is provided to the S lead, the flip-flop is set to its 1-state and remains in the 1-state as long as the zero voltage potential remains on the S lead irrespective of any signals on the J, K and G1 leads. When a zero voltage potential is applied to the R lead, the flip-flop is reset to its 0-state and remains in the 0-state as long as the zero potential remains on the R lead irrespective of the J, K and G1 leads.

The POWER-ON SIGNAL causes the pulse generator 12 to supply REFRESH CLOCK pulses to refresh address counter 11 as described above. The refresh address counter provides REFRESH TIME signals to the G1 input lead of flip-flop 61 and to the lower input lead of NAND-gate 65. In the absence of negative signals being applied to the S and R leads, these REFRESH TIME signals cause flip-flop 61 to alternately change state. One of the negative going pulses on the G1 input lead of flip-flop 61 cause the $\overline{Q}$ output voltage of flip-flop 61 to become positive as shown in the waveform of FIG. 11. When the refresh time signal again goes positive at time tA of FIG. 11, NAND-gate 65 is enabled so that a negative going signal at the output lead of NAND-gate 65 causes the flip-flop 60 to be set. When flip-flop 60 is set, a REFRESH signal is produced by control and timing circuit 16. The REFRESH signal is applied to the row address selector 18 of FIG. 1, to the column address selector 19 and to AND-gate 22 illustrated in FIG. 1. The positive voltage which had been on the $\overline{Q}$ output lead of 60 is coupled through delay line 58 to the lower lead of NAND-gate 63 and the positive going REFRESH voltage coupled to the upper lead of gate 63 causes gate 63 to provide a negative going pulse to the upper lead of NAND-gate 42. The negative going pulse on the upper lead of NAND-gate 42 causes gate 42 to provide a positive pulse which is applied to the upper lead of NAND-gate 44 and to delay line 48. This positive pulse on the input lead of delay line 48 is propagated through the delay line and applied to inverter 51, inverter 52, inverter 53 and to the lower input lead of NAND-gate 45. The voltages on the two leads of NAND-gate 45 cause the gate 45 to provide a negative going CHIP ENABLE signal which is coupled to the dynamic memory 21 of FIG. 1. The voltage applied to the upper lead of NAND-gate 44 and the delayed voltage from delay line 48 coupled through inverter 51 cause NAND-gate 44 to provide a negative PRECHARGE pulse which is coupled to the dynamic memory 21 of FIG. 1. In a similar manner a WRITE TIMING pulse is developed by NAND-gate 46, inverter 53 and delay line 49. This WRITE TIMING pulse is coupled to the lower lead of the NAND-gate 24 of FIG. 1. When the upper lead of NAND-gate 24 is enabled by a signal from OR-gate 23 the WRITE TIMING pulse is coupled through gate 24 and becomes the R/W pulse which is coupled to the dynamic memory 21 of FIG. 1.

The function of the control and timing circuit 16 is to produce control signals that will result in data either being written into the memory or being read out of the memory and to periodically refresh the data stored in the cells of the dynamic MOS memory. The details of the control and timing circuit are conventional and do not form a part of this invention.

Details of the write data register 28 of FIG. 1 are shown in FIG. 4. The write data register includes a plurality of binary latches 68 which are normally used to store temporarily data from processor 26 until the data in the register is written into the memory 21. As shown in FIG. 4, the power-on signal is coupled to the reset leads R of each of the latches 68, there being a latch for each array of cells into which data can be written during a write cycle. The latches are reset when the power supply 10 is energized. This causes binary zeros to be stored in each of the latches 68 so that a binary zero can be written in the cells of the dynamic memory 21 of FIG. 1 during a refresh cycle until F/F 15 is set by the END OF PASS signal which is produced after data on the DATA IN line has been written into each cell of an array at which time memory 21 has been initialized. After the cells in each array have been initialized, processor 26 is able to write data into memory 26 by means of the latches 68 or write data register 28. A latch which may be used is the 9314 which is available from several manufacturers. A more detailed description of the 9314 is included in the booklet "Fairchild TTL Family," October 1970, by Fairchild Semiconductor, Mountainview, Calif.

Figure 5:
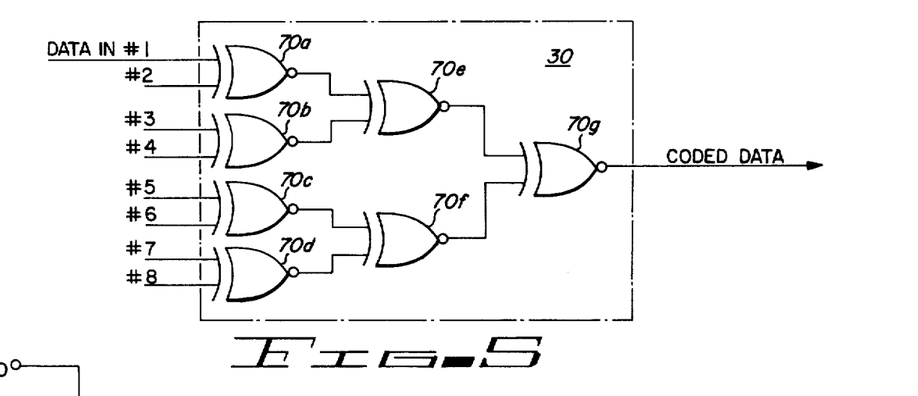

Error code or parity bit generator 30 of FIG. 1 may consist of a plurality of conventional parity bit generators. The bits so produced are commonly used by EDAC circuits which are conventional and not illustrated since they form no part of this invention, to detect errors in data stored in a memory. One such parity bit generator is shown in FIG. 5. It includes a plurality of exclusive OR-gates 70a–70g. The exclusive OR-gates disclosed in FIG. 4 provide a zero output signal representing a binary zero when an even number of input signals have a positive voltage representing a binary one. The symbol identified by the numeral 70a in FIG. 4 is a 2-input exclusive OR-gate. This gate delivers a binary one output when one and only one of its input signals represents a binary one. A plurality of these circuits, eight in a preferred example, provide eight parity bits, which are written into the dynamic memory 21 along with 72 data bits.

The elements that permit the circuit means for periodically refreshing data represented by a voltage stored in the cells of a dynamic MOS memory to be used to write data into the memory 21 to initialize it, are that portion of the refresh address counter 11 that produces signals $R_5$–$R_9$, end of pass flip-flop 15, AND-gate 22, and OR-gate 23.

When a computer has its source of electrical power turned on, the power supply for the logic circuits which are not illustrated are energized first. Then power supply 10 is energized. When power supply 10 is energized, refresh address counter 11 is set to its initial condition, write data register 28 is set so that all the latches and all data lines connected to the latches have low voltage levels representing binary zeros in the preferred example. Simultaneously control and timing circuit 16 is also initialized. When power supply 10 is energized, pulse generator 12 begins to produce REFRESH CLOCK signals. Counter 11 in response to the REFRESH CLOCK signals produces signals representing row addresses which are applied to row address selector 18 which in turn produces row address signal $A_0$–$A_4$ which are applied to the dynamic memory 21 each time a REFRESH signal is produced by control and timing circuit 16. Counter 11 also produces signals representing column addresses which are applied to column address selector 19 which provides column address signals $A_5$–$A_9$ to the dynamic memory each time a REFRESH signal is produced.

In the preferred example, the period of pulse generator 12 is 8 microseconds, and a REFRESH signal is produced by control and timing circuit 16 once every 32 microseconds. During the period beginning when power supply 10 is energized, end of pass flip-flop is providing a $\overline{Q}$ signal which permits the AND-gate 22 to connect REFRESH signal from control and timing circuit 16 through AND-gate 24 so that when a WRITE TIMING signal is applied to gate 24 a R/W pulse is produced and applied to the memory 21. At such time, timing and control signals are produced by circuit 16 so that data represented by the state of the latches in the write data register 28 is written into the location in each array corresponding to the row and column address signals A0–A4 and $A_5$–$A_9$. In the preferred embodiment, for each memory address there is a cell in each of 72 arrays in which data bits are stored and a cell in each of 8 arrays in which parity bits are stored for use in error detection and correction.

As a result, during the initialization period following energization of power supply 10, for a period of time of substantially less then one second, during each refresh cycle, i.e., when control and timing circuit 16 produces a REFRESH pulse, data represented by the state of the latches in write data register 28 are written into the cells corresponding to the row and column address signals produced by refresh address counter 16, and row and column selectors 18 and 19. It should also be noted that every time a REFRESH pulse is produced that all of the cells in that row of each array are also refreshed.

While the principles of the invention have now been made clear in an illustrative embodiment, there will be many obvious modifications of the structure, proportions, materials and components without departing from those principles. The appended claims are intended to cover any such modifications.

I claim:

1. In a dynamic memory having a plurality of memory cells arranged in an array of m columns and n rows where m and n are integers; a power supply for said memory; a write data register; control and timing means, said memory adapted upon the application to it of appropriate signals from the control and timing means to write data stored in the write data register into a given cell, to read data from a given cell, and to restore the data stored in a given cell; clock means for producing clock signals; address means responsive to said clock signals for sequentially producing row address signals and a refresh time signal; the control and timing means responsive to said refresh time signal producing a refresh signal; said memory, in response to row address signals being gated to it in response to a refresh signal and other appropriate signals being applied to the memory, restoring the data stored in the cells of the row corresponding to said row address signals; said address signals, refresh signal and other appropriate signals being applied to the memory at a frequency such that the data stored in all the cells of the array are refreshed while the data stored in the memory cells has a high probability of being valid;

the improvements comprising:

providing said address means with the capability of sequentially producing column address signals;

means responsive to each refresh signal for gating said column address signals to said memory;

and initializing circuit means responsive to the energizing of said power supply for enabling the control and timing means to cause data from the write data register to be written into the cell corresponding to the row and column address signals applied to the memory each time a refresh signal is produced until all the cells of the array have data written into them, whereupon said initializing circuit means no longer causes data to be written into said memory when a refresh signal is produced.

2. In a dynamic memory having a plurality of arrays of dynamic memory cells, each array having a plurality of memory cells arranged in $m$ columns and $n$ rows, where $m$ and $n$ are integers, a power supply for said memory; a write data register in which signals representing data to be written into the cells of the memory are stored; control and timing means, each array upon the application to it of appropriate signals from the control and timing means adapted to write data from the write data register into a given cell, to read data from a given cell and to restore the data stored in a given cell; clock means for producing clock signals; address means responsive to said clock signals for sequentially producing row address signals, said address means also producing a refresh time signal each time it produces row address signals representing the address of a different row; said control and timing means responsive to said refresh time signal for producing a refresh signal; and means responsive to each refresh signal for gating row address signals to the memory; said memory in response to row address signals and other appropriate signals produced by the control and timing means restoring the data stored in the cells of the row of each array corresponding to the row address signals; the period between refresh signals being not greater than the period during which data stored in a memory cell has a high probability of being valid divided by $n$ the number of rows in each array;

the improvements comprising:

providing said address means with the capability of sequentially producing column address signals responsive to said clock signals, means responsive to each refresh signal for gating said column address signals to said memory, the relationship between the row and column address signals being such that a different cell in the array is addressed sequentially during the period each refresh signal is produced, said address means, control and timing means and write data register being initialized responsive to the energizing of said power supply, and initializing circuit means responsive to the energizing of said power supply for enabling the control and timing circuit to apply appropriate signals to each of the arrays responsive to each refresh signal so that data stored in the write data register is written into the cell of the arrays having the row and column address applied to the arrays until all the cells of all the arrays have data written into them, whereupon said initializing circuit means no longer applies signals to said memory when a refresh signal is produced to permit data stored in said write data register to be written in cells of said dynamic memory.

3. In combination: a dynamic memory having a plurality of memory cells, said cells being arranged in an array of columns and rows, a power supply;

clock means for producing clock signals;

address means responsive to said clock signals for sequentially producing row address and column address signals and a refresh time signal concurrently with each change of said address signals;

control and timing means responsive to said refresh time signal for producing a refresh signal; said control and timing means also producing timing and control signals necessary to write data into a cell, to read data from a cell and to refresh data stored in a cell;

a write data register;

means responsive to each refresh signal for gating said column address signals to said memory;

said memory in response to a row address signal being gated to it by a refresh signal and in the presence of other appropriate signals being applied to the dynamic memory by said control and timing means restoring the data stored in the cells of the row corresponding to said row address signals, said row address signals and other appropriate signals being applied to the memory at a frequency such that the data stored in all the cells of the arrays are refreshed while the data stored in a memory cell has a high probability of being valid;

and initializing circuit means responsive to said power supply being energized for enabling the control and timing circuit to apply write signals to the memory responsive to each refresh signal so that data from the write data register is written into the cell corresponding to the row and column address signals applied to the memory until all the cells of the array have data written into them, whereupon said initializing circuit means no longer enables the control and timing circuit to apply a write signal to said memory when a refresh signal is produced.

4. In combination: a dynamic memory having a plurality of arrays of memory cells, the cells of each array being arranged in columns and rows, a power supply, clock means for producing clock signals;

address means responsive to said clock signals for sequentially producing row address and column address signals and a refresh time signal concurrently with each change of said address signals;

control and timing means responsive to said refresh time signal for producing a refresh signal; said control and timing means also producing the signals necessary to write data into a cell in an array, to read data from a cell of one array and to refresh data stored in a row of cells of an array;

a write data register;

means responsive to each refresh signal for gating said row address signals to the arrays of said memory;

said memory in response to a row address signal being gated to it by a refresh signal and in the presence of other appropriate signals from the control and timing means being applied to the dynamic memory restoring the data stored in the cells of the row of each array corresponding to said row address signals, said row address signals and other appropriate signals being applied to the memory at a frequency such that the data stored in all the cells of arrays are refreshed while the data stored in the memory cells has a high probability of being valid;

means responsive to each refresh signal for gating said column address signals to the arrays of said memory, and initializing circuit means responsive to said power supply being energized for enabling the control and timing circuit to apply signals to the memory arrays responsive to each refresh signal so that data stored in the write data register is written into the cells of the arrays corresponding to the row and column address signals applied to the memory until all the cells of all the arrays have data written into them, whereupon said initializing circuit means no longer permits data stored in the write data register to be written into the memory when the timing and control circuit produces a refresh signal.

* * * * *